(12) United States Patent
Okuuchi

(10) Patent No.: US 9,276,153 B2
(45) Date of Patent: Mar. 1, 2016

(54) SOLAR CELL WAFER AND METHOD OF PRODUCING THE SAME

(75) Inventor: Shigeru Okuuchi, Tokyo (JP)

(73) Assignee: SUMCO Corporation, Tokyo (JP)

( * ) Notice: Subject to any disclaimer, the term of this patent is extended or adjusted under 35 U.S.C. 154(b) by 79 days.

(21) Appl. No.: 13/261,672

(22) PCT Filed: Jan. 18, 2012

(86) PCT No.: PCT/JP2012/051482
§ 371 (c)(1),
(2), (4) Date: Jun. 11, 2013

(87) PCT Pub. No.: WO2012/102280
PCT Pub. Date: Aug. 2, 2012

(65) Prior Publication Data
US 2013/0291925 A1  Nov. 7, 2013

(30) Foreign Application Priority Data

Jan. 26, 2011 (JP) ................... 2011-014496
Jun. 1, 2011 (JP) ................... 2011-123295

(51) Int. Cl.
*H01L 31/052* (2014.01)
*H01L 31/18* (2006.01)
*H01L 21/302* (2006.01)
*H01L 31/0236* (2006.01)
(Continued)

(52) U.S. Cl.
CPC ........ *H01L 31/0527* (2013.01); *H01L 31/0216* (2013.01); *H01L 31/02363* (2013.01); *H01L 31/18* (2013.01); *H01L 21/0203* (2013.01); *Y02E 10/50* (2013.01)

(58) Field of Classification Search
CPC .............. Y02E 10/50; H01L 31/02168; H01L 31/02363
USPC ................................. 216/24, 56, 87
See application file for complete search history.

(56) References Cited

U.S. PATENT DOCUMENTS 6,230,720 B1 * 5/2001 Yalamanchili .... H01L 21/02052
134/1.3
6,329,296 B1  12/2001 Ruby et al.
(Continued)

FOREIGN PATENT DOCUMENTS

CN  101238586 A  8/2008
CN  101573801 A  11/2009
(Continued)

OTHER PUBLICATIONS

Korean Office Action dated Oct. 30, 2014, in corresponding Korean patent application No. 10-2013-7015042 (6 pages).
(Continued)

*Primary Examiner* — Shamim Ahmed
(74) *Attorney, Agent, or Firm* — Thomas J. Engellenner; Reza Mollaaghababa; Pepper Hamilton LLP

(57) ABSTRACT

A solar cell wafer having a porous layer on a surface of a semiconductor wafer typified by a silicon wafer, which can further reduce reflection loss of light at the surface. A solar cell wafer 100 of the present invention has a porous layer 11 having a pore diameter of 10 nm or more and 45 nm or less, on at least one surface 10A of a semiconductor wafer 10, and the layer thickness of the porous layer 11 is more than 50 nm and 450 nm or less.

5 Claims, 10 Drawing Sheets
(1 of 10 Drawing Sheet(s) Filed in Color)

(51) Int. Cl.
*H01L 31/0216* (2014.01)
*H01L 21/02* (2006.01)

(56) References Cited

U.S. PATENT DOCUMENTS

| | | | |
|---|---|---|---|
| 8,883,543 B2 * | 11/2014 | Okuuchi | 438/71 |
| 2005/0009374 A1 * | 1/2005 | Gao et al. | 438/796 |
| 2005/0250297 A1 * | 11/2005 | Shive et al. | 438/471 |
| 2006/0185688 A1 * | 8/2006 | Uematsu | H01L 21/02052 134/2 |
| 2007/0049056 A1 * | 3/2007 | Pagliaro, Jr. | 438/787 |
| 2008/0176400 A1 * | 7/2008 | Hachigo et al. | 438/691 |
| 2009/0280597 A1 * | 11/2009 | Wijekoon et al. | 438/71 |
| 2009/0311821 A1 * | 12/2009 | Dimitrov et al. | 438/71 |
| 2010/0012185 A1 * | 1/2010 | Schmid et al. | 136/256 |
| 2010/0029034 A1 | 2/2010 | Nishimoto | |
| 2010/0078334 A1 * | 4/2010 | Woodruff et al. | 205/671 |
| 2010/0084009 A1 * | 4/2010 | Carlson et al. | 136/255 |
| 2011/0092074 A1 * | 4/2011 | Mayer et al. | 438/745 |
| 2011/0162709 A1 * | 7/2011 | Habermann | 136/256 |

FOREIGN PATENT DOCUMENTS

| | | | |
|---|---|---|---|
| JP | 03083339 | A | 4/1991 |
| JP | 06169097 | A | 6/1994 |
| JP | 200515308 | A | 1/2005 |
| JP | 2006140426 | A | 6/2006 |
| JP | 2007194485 | A | 8/2007 |
| TW | 201001500 | A | 1/2010 |
| TW | 201031009 | A1 | 8/2010 |
| WO | 2009025502 | A2 | 2/2009 |
| WO | 2009/054076 | A1 | 4/2009 |
| WO | 2009054076 | A1 | 4/2009 |

OTHER PUBLICATIONS

English translation of Office Action from Taiwan Intellectual Property Office, dated Oct. 29, 2014, in corresponding Taiwan Application No. 101102893 (4 pages).

J.S. Kim et al., "The Role of Metal Induced Oxidation for Copper Deposition on Silicon Surface," J. Electrochem., Soc., 1997, vol. 144, No. 9, pp. 3275-3283.

English translation of Notification of Reasons for Refusal dated Sep. 9, 2014, in corresponding Japanese Application No. 2011-014496 (2 pages).

International Search Report, PCT/JP2012/051482, mailed Mar. 6, 2012 (2 pages).

English translation of Office Action dated Aug. 11, 2014 in corresponding German App. No. 11 2012 000 576.7 (6 pages).

English translation of Office Action from Chinese Patent Office in corresponding Chinese Application No. 201280006626.2, dated Apr. 10, 2015 (9 pages).

English translation of Office Action from Chinese Patent Office in corresponding Chinese Application No. 201280006626.2, dated Jul. 23, 2015 (16 pages).

* cited by examiner

FIG. 2
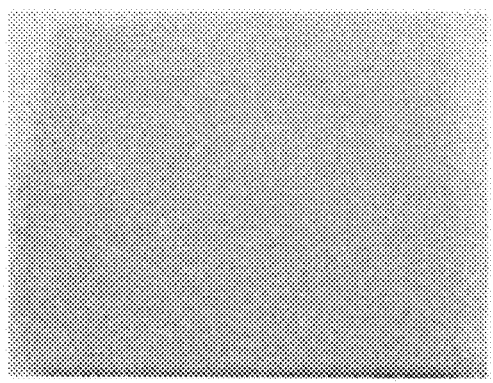
(a) As ET
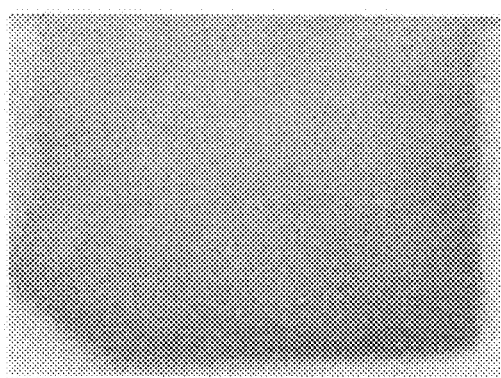
(b) No treatment
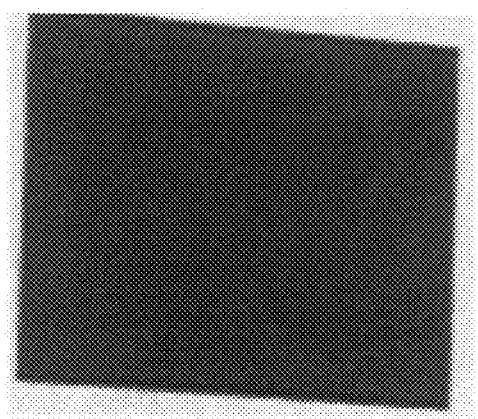
(c) IPA treatment
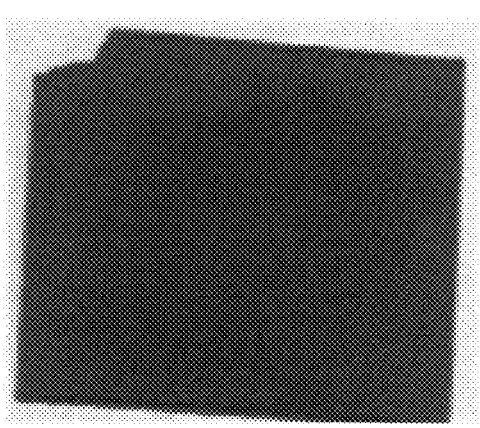
(d) ETOH treatment

FIG. 3
(a)
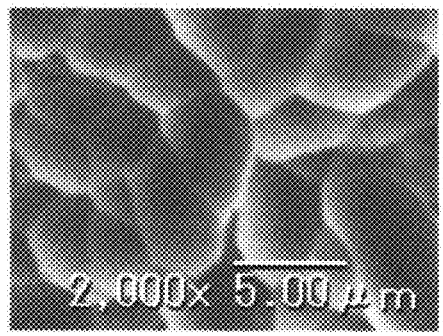
As ET
(b)
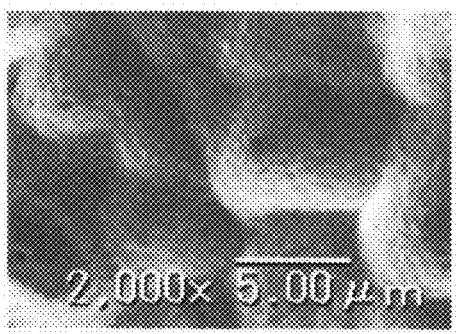
No treatment
(c)
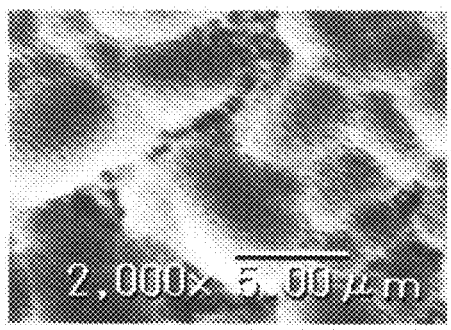
IPA treatment
(d)
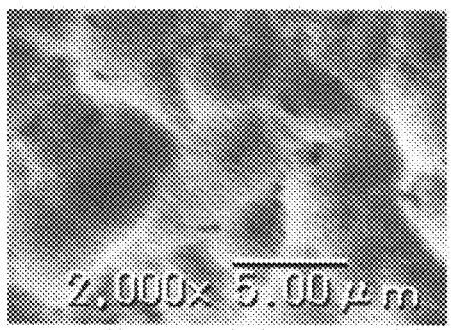
ETOH reatment

FIG. 4
(a)
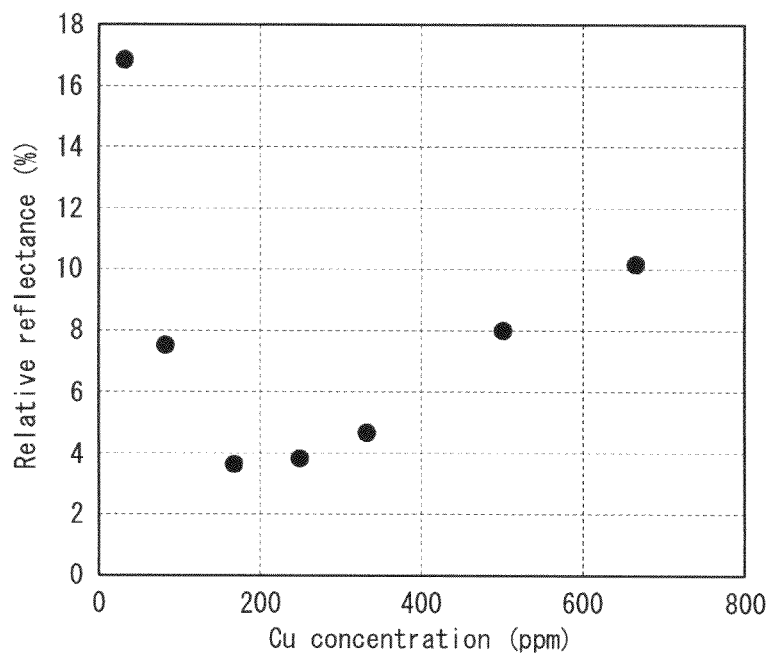
(b)
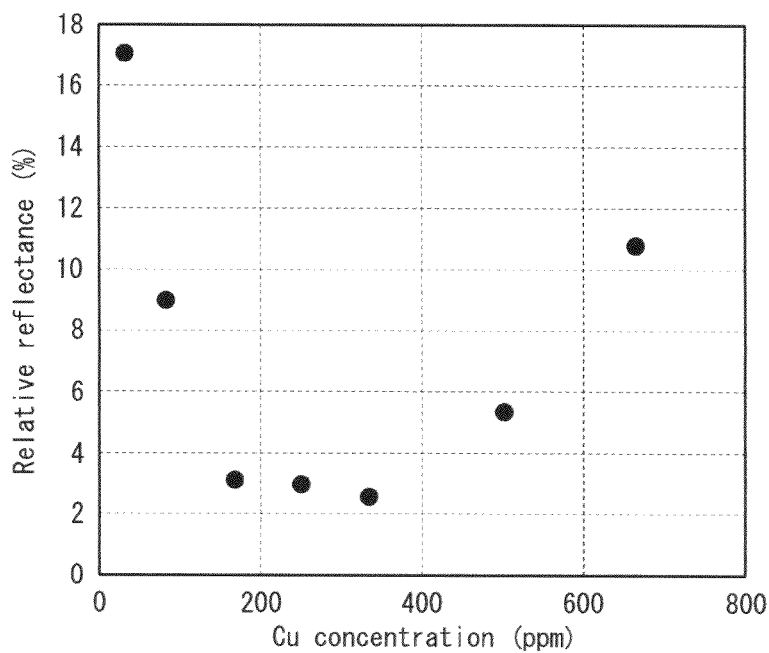

FIG. 5
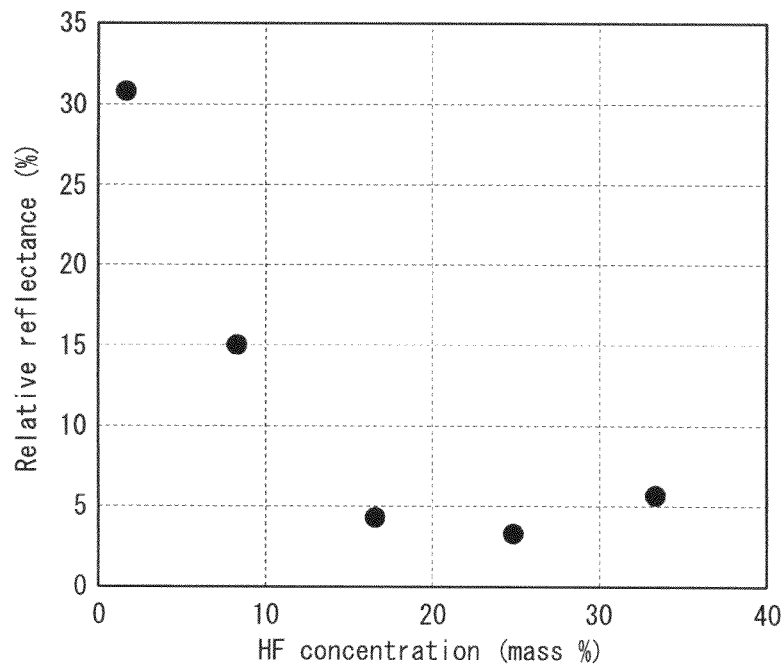
(a)
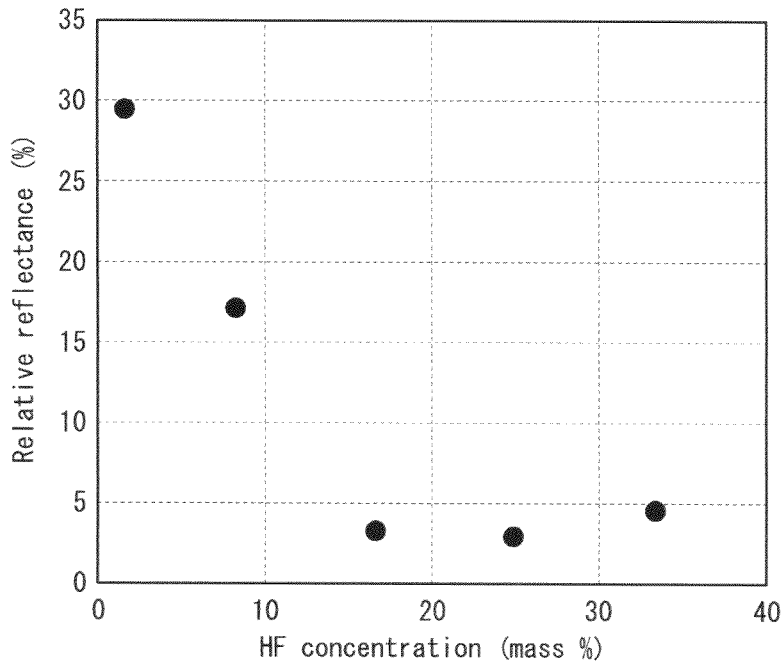
(b)

FIG. 7
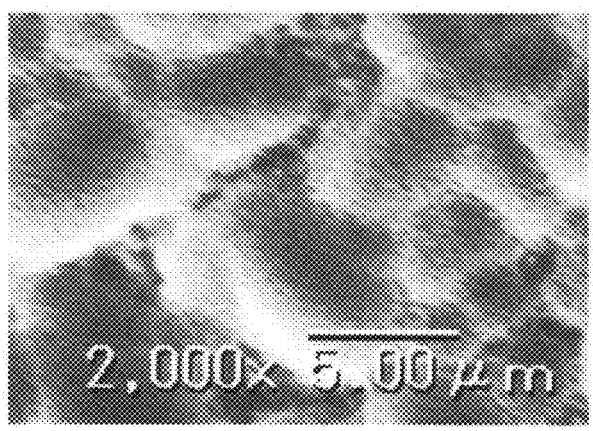
(a) IPA treatment
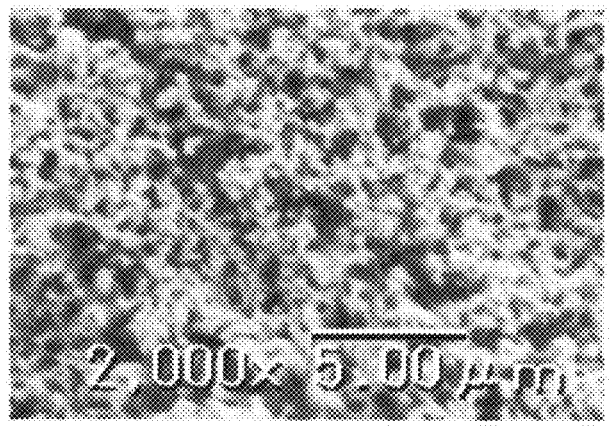
(b) HF dipping treatment without light exposure (1hr)
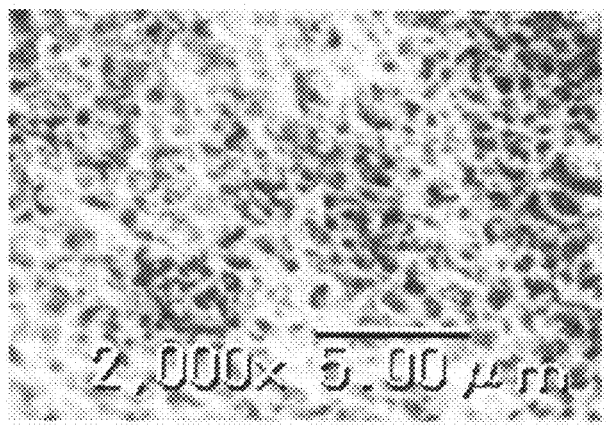
(c) HF dipping treatment with light exposure (1hr)

SOLAR CELL WAFER AND METHOD OF PRODUCING THE SAME

TECHNICAL FIELD

The present invention firstly relates to a method of producing a solar cell wafer, a method of producing a solar cell, and a method of producing a solar cell module.

The present invention secondly relates to a solar cell wafer, a solar cell, and a solar cell module.

BACKGROUND ART

In general, a solar cell is formed using a semiconductor wafer typified by a silicon wafer. In order to enhance the conversion efficiency of a solar cell, it is necessary to reduce light reflected by a light receiving surface of the solar cell and light transmitted by the solar cell. In order to improve the conversion efficiency, for example, in a case where a crystalline solar cell is fabricated using a silicon wafer, since silicon wafers transmit low percentage of visible light which contributes to photoelectric conversion; consideration should be given to reduction of reflection loss of visible light at the silicon wafer surface serving as the light receiving surface and effective confinement of incident light into the solar cell.

Techniques for reducing reflection loss of incident light at a silicon wafer surface include a technique of forming an antireflection film on the surface and a technique of forming irregular features such as a so-called textured structure having pyramid-shaped micro recesses and micro protrusions. The method of forming a textured structure on the surface, of the latter technique, is a method suitable for single crystal silicon, which is typified by a method of etching a (100) single crystal silicon surface with an alkaline solution. This method makes use of etching using alkali which causes slower etching rate on the (111) face than on the (100) face and the (110) face. Further, as the latter technique, a technique of reducing reflection loss of incident light by making a silicon surface porous to form irregular features on the surface has been proposed in recent years.

PTL 1 (JP 06-169097A) discloses a method of forming many micropores on a surface of a single crystal silicon substrate by anodization in which electric current is flown in hydrofluoric acid using the single crystal silicon substrate as an anode and Pt as a cathode. PTL 2 (JP 2004-5063301) discloses a method of forming a porous layer having many regular pores in the direction perpendicular to the wafer surface by reactive ion etching (RIE).

PTL 3 (JP 2007-194485A) discloses a method of forming, on a silicon substrate surface on which a micron-size textured structure has been formed, more microscopic irregularities of the submicron order by coating the surface with metal particles by electroless plating, and then etching the substrate with a mixed aqueous solution of an oxidant and hydrofluoric acid. Specifically, the alkali textured p-type single crystal silicon substrate is dipped in an aqueous solution containing silver perchlorate and sodium hydroxide to form silver microparticles on its surface. After that, the substrate is dipped in a mixed solution of a hydrogen peroxide solution, hydrofluoric acid, and water, thereby forming irregularities of the submicron order.

CITATION LIST

Patent Literature

PTL 1: JP 06-169097A
PTL 2: JP 2004-506330T
PTL 3: JP 2007-194485A

SUMMARY OF INVENTION

Technical Problem

However, first in view of the production method, the foregoing techniques had problems as follows. First, the method using anodization in the PTL 1 requires a large and expensive DC power supply, and it also uses a mixed solution of an organic solvent and hydrofluoric acid; therefore, difficulties remain with respect to handling and safety during rinsing. The method using reactive ion etching in PTL 2 has a problem in terms of cost, since it requires an ion implantation system dedicated to the RIE process. In the method disclosed in PTL 3, the mixed aqueous solution is required to contain an oxidant. However, oxidants are expensive in general, which leads to high reagent cost. In particular, when a hydrogen peroxide solution is used as the oxidant, the hydrogen peroxide solution must be treated by special liquid waste disposal in consideration of the influences on the ecosystem in conformance with the liquid waste regulations. Therefore, in addition to the cost problem, the effluent treatment becomes complex. Accordingly, the techniques of making a silicon surface porous for reducing reflection loss of incident light have not been used successfully.

Methods of reducing reflection loss of incident light by making a silicon surface porous are expected to reduce more reflection loss than by forming a normal textured structure. Therefore, a novel method for making a porous structure which solves the problems of safety and cost is demanded.

Second, in view of solar cell wafers, reflection loss of incident light is not sufficiently reduced in solar cell wafers obtained by those methods of making a porous structure. As solar cells having higher conversion efficiency are now demanded, solar cell wafers making it possible to further reduce the reflection loss of incident light are demanded.

In view of the first problem above, the first object of the present invention is to provide a method of producing a solar cell wafer at whose surface reflection loss of light can be reduced by making a surface of a semiconductor wafer typified by a silicon wafer porous in a safe and inexpensive manner; and a method of producing a solar cell and a method of producing a solar cell module that include the method of producing a solar cell wafer.

In view of the second problem above, the second object of the present invention is to provide a solar cell wafer, a solar cell, and a solar cell module, which have a porous layer on a surface of a semiconductor wafer typified by a silicon wafer and can further reduce reflection loss of light at the surface.

Solution to Problem

As a result of intensive studies and a process of trial and error of various methods of making a porous structure for achieving the foregoing first object, the present inventor found that reflection loss of light at a semiconductor wafer surface can be effectively reduced by forming irregularities of the submicron order on the surface using the method shown below. Thus, the inventor completed the first group of the present inventions. The first group of the present inventions is based on the above finding and studies, and it primarily includes the following components.

A method of producing a solar cell wafer by making at least one surface of a semiconductor wafer porous in accordance with the present invention, includes the steps of:

a first step of applying a lower alcohol solution to the at least one surface of the semiconductor wafer; and a second step of applying hydrofluoric acid containing metal ions to the at least one surface of the semiconductor wafer after the first step.

In the invention, it is preferable that the semiconductor wafer is a silicon wafer, and the metal ions are ions of a metal more noble than Si.

In the invention, it is preferable to further perform a third step of applying hydrofluoric acid free of the metal ions to the at least one surface of the semiconductor wafer after the second step.

In the invention, the second step and/or the third step are preferably performed with the semiconductor wafer being exposed to light.

In the invention, it is preferable to further perform a step of applying a solution for removing metal precipitated from the metal ions from the one surface, to the at least one surface of the semiconductor wafer after the second step.

In the invention, the concentration of the metal is preferably 10 ppm or more and 1000 ppm or less.

In the invention, a treatment time in the second step is preferably 30 min or less.

A method of producing a solar cell in accordance with the present invention includes the steps in the above method of producing a solar cell wafer and a step of fabricating a solar cell using the solar cell wafer.

A method of producing a solar cell module in accordance with the present invention includes the steps in the above method of producing a solar cell and a step of fabricating a solar cell module using the solar cell.

As a result of intensive studies and a process of trial and error of various methods of making a porous structure for achieving the foregoing second object, the present inventor found that reflection loss of light at a semiconductor wafer surface can be effectively reduced in a solar cell wafer on which a porous layer having a specific structure is formed. Thus, the inventor completed the second group of the present inventions. According to the studies of the present inventor, of solar cell wafers which can be obtained by the production method of the first group of the present inventions, wafers that in particular can reduce reflection loss of light are found to correspond to solar cell wafers according to this second group of the present inventions. The second group of the present inventions is based on the above finding, and it primarily includes the following components.

A solar cell wafer of the present invention includes a porous layer having a pore diameter of 10 nm or more and 45 nm or less on at least one surface of a semiconductor wafer, wherein the layer thickness of the porous layer is more than 50 nm and 450 nm or less.

In the invention, pores in the porous layer are preferably meandering. Further, the surface reflectance of the solar cell wafer at a wavelength of 600 nm is preferably 10% or less.

A solar cell of the present invention includes the above solar cell wafer and electrodes formed on the solar cell wafer.

A solar cell module of the present invention includes a plurality of the above solar cells which are arranged on a substrate.

Advantageous Effect of Invention

According to the first group of the present inventions, large-scale apparatuses such as a DC power supply and an ion implantation system are not necessary, and mixing of hydrofluoric acid with an organic solvent and use of an oxidant with hydrofluoric acid are not required. Thus, a solar cell wafer at whose surface reflection loss of light is reduced can be obtained by making a surface of a semiconductor wafer typified by a silicon wafer porous in a safer and less expensive manner than conventional techniques.

According to the second group of the present inventions, reflection loss of incident light can be further reduced.

BRIEF DESCRIPTION OF DRAWINGS

The patent or application file contains at least one drawing executed in color. Copies of this patent or patent application publication with color drawing(s) will be provided by the Office upon request and payment of the necessary fee.

FIG. 2(a) is a photograph taken of the surface of a silicon wafer which has been etched with an acid solution but not been subjected to the process of making a porous structure in accordance with the first group of the present inventions. FIG. 2(b) is a photograph taken of the surface of a silicon wafer of Comparative Example 1. FIG. 2(c) is a photograph taken of the surface of a silicon wafer of Example 1. FIG. 2(d) is a photograph taken of the surface of a silicon wafer of Example 2.

FIGS. 3(a) to 3(d) are SEM images of the silicon wafer surfaces in FIGS. 2(a) to 2(d), respectively.

FIGS. 4(a) and 4(b) are graphs each showing the relationship between Cu concentration and relative reflectance at the silicon wafer surface in the second step. In FIG. 4(a), the relative reflectance at a wavelength of 600 nm is on the vertical axis, whereas in FIG. 4(b), the relative reflectance at a wavelength of 700 nm is on the vertical axis.

FIGS. 5(a) and 5(b) are graphs each showing the relationship between hydrofluoric acid concentration and relative reflectance at the silicon wafer surface in the second step. In FIG. 5(a), the relative reflectance at a wavelength of 600 nm is on the vertical axis, whereas in FIG. 5(b), the relative reflectance at a wavelength of 700 nm is on the vertical axis.

In FIG. 6(a), the relative reflectance at a wavelength of 600 nm is on the vertical axis, whereas in FIG. 6(b), the relative reflectance at a wavelength of 700 nm is on the vertical axis.

FIGS. 7(a) to 7(c) are SEM images each showing a surface of a silicon wafer. FIG. 7(a) is a SEM image of a silicon wafer which has been subjected to steps up to the second step in the first group of the present inventions. FIG. 7(b) is a SEM image of the sample in FIG. 7(a) which has been subjected to the third step with light being blocked. FIG. 7(c) is a SEM image of a sample similar to the one in FIG. 7(a) which has been subjected to the third step with the sample being exposed to light.

DESCRIPTION OF EMBODIMENT(S)

Figure 1:
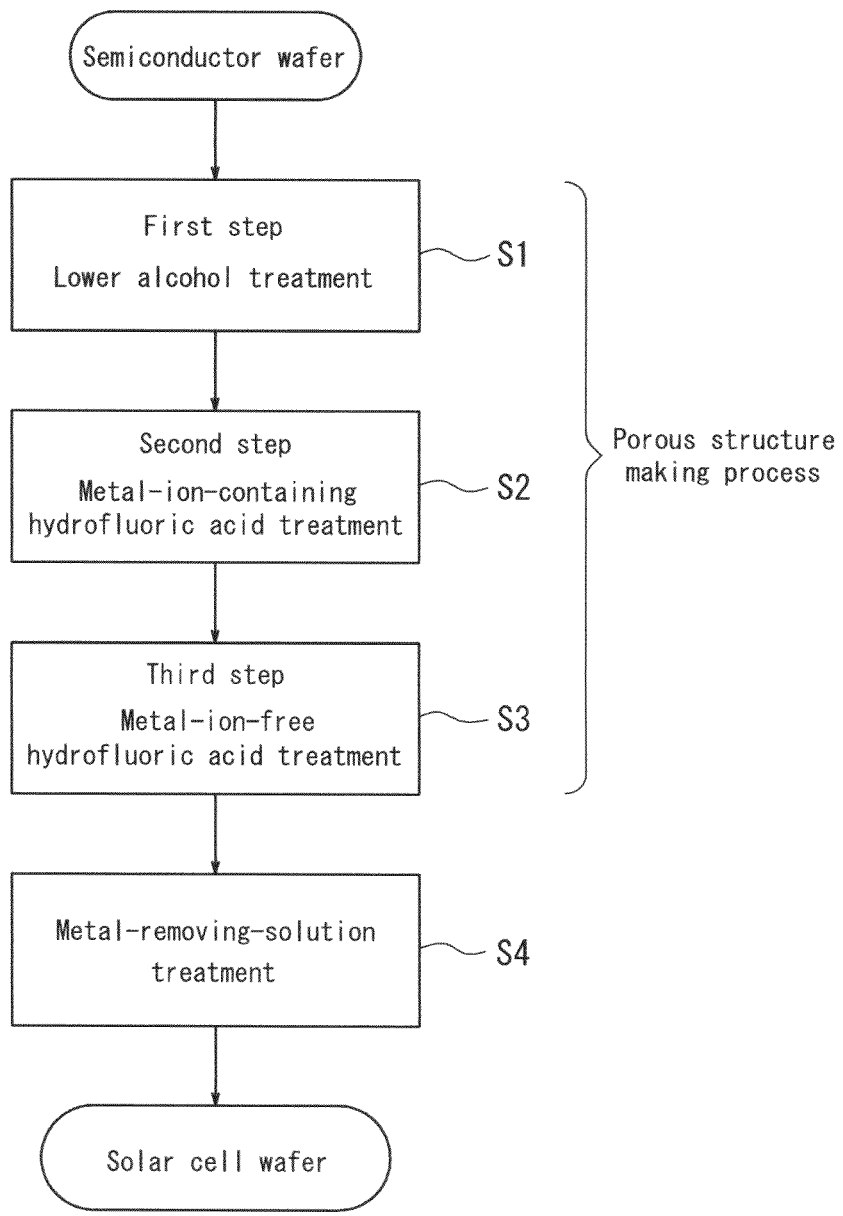
FIG. 1 is a flowchart of an exemplary method of producing a solar cell wafer in accordance with the first group of the present inventions.

The first group of the present inventions will be described in more detail below with reference to the drawings. FIG. 1 is a flowchart of an exemplary method of producing a solar cell wafer in accordance with the first group of the present inventions. Semiconductor wafers used in the first group of the present inventions are not limited in particular. First, a method of producing a single crystal or polycrystalline silicon solar cell wafer with the use of a single crystal or polycrystalline silicon wafer (hereinafter collectively referred to simply as "wafer") by making a porous structure on the wafer surface will be described below as an embodiment.

A single crystal silicon wafer obtained by slicing, using a wire saw or the like, a single crystal silicon ingot grown by the Czochralski process (CZ process) or the like can be used. The crystal planes of the wafer surface can be selected as needed. For example, the surface may have (100), (001), or (111) planes. Polycrystalline silicon wafers can be obtained by slicing a polycrystalline silicon ingot.

In either case of using a single crystal silicon wafer or a polycrystalline silicon wafer, a surface of the wafer sliced out of an ingot has damages such as cracking and crystal strain, which are introduced into the silicon layer by the slicing. Therefore, it is preferable to rinse a wafer after slicing and to etch the surface of the wafer with acid or alkali, thereby removing a damaged surface. The depth of the above damage caused by slicing is a factor determined depending on the slicing conditions, and the depth is roughly 10 μm or less. Thus, the damage can be removed by a common etching process using alkali such as KOH or mixed acid of hydrofluoric acid (HF) and nitric acid ($HNO_3$).

The first group of the present inventions is a method of making at least one surface of a wafer porous to obtain a solar cell wafer. Accordingly, a "solar cell wafer" herein means a wafer at least one surface of which is made porous (to have a porous structure). The one surface serves as a light receiving surface in a solar cell. The process of the first group of the present inventions characteristically includes a first step of applying a lower alcohol solution to at least one surface of a wafer (step S1), and a second step of applying hydrofluoric acid containing metal ions to the at least one surface of the wafer (step S2) after the first step.

The technical meaning of employing the characteristic process will be described below with the operation and effect. The details of the process will be described later. After acid etching, an air-dried p-type (100) single crystal silicon wafer was dipped in a lower alcohol such as 2-propanol (isopropyl alcohol; IPA) for a predetermined time, and was then dipped in hydrofluoric acid in which copper (Cu) was dissolved, for a predetermined time. Thus, the present inventor found that the wafer surface apparently turned to black and the reflectance at each of the wavelengths throughout the visible spectrum was low. Further, a scanning electron microscope (SEM) image of the wafer surface was found to show the surface with irregularities of approximately several micrometers, and a number of finer irregularities formed thereon. The present inventor completed the first group of the present inventions based on this finding.

The mechanism of how the semiconductor wafer surface can be made porous by such surface treatment is not completely clear. However, the present inventor estimates that the porous structure is made by the following reaction mechanism. When a wafer is dipped in hydrofluoric acid in which Cu is dissolved, in the second step; Cu is deposited as a number of microparticles, with some nucleus on the wafer surface being a starting point of the deposition. This reaction is a reduction reaction of $Cu^{2+}+2e^-\rightarrow Cu$. Electric transfer during the reaction is accompanied by depletion of electrons from Si on the wafer surface and dissolution of Si at positions where Cu microparticles are deposited. Here, two models are considered with respect to the function of hydrofluoric acid. One is a model in which $SiO_2$ is dissolved by hydrofluoric acid instantaneously each time $SiO_2$ is generated by the reaction between Si and water at the Si dissolution positions to make a porous structure (Ohmi model). The other is a model in which fluorine ions directly oxidize Si (Chemla model). The details of such a reaction are described in J. Electrochem. Soc. 144, 3275 (1997) "The Role of Metal Induced Oxidation for Copper Deposition on Silicon Surface" and J. Electrochem. Soc. 144, 4175 (1997) "Electrochemical and radiochemical study of copper contamination mechanism from HF solution onto silicon substrates". In the first group of the present inventions, a wafer surface is treated with a lower alcohol which is a non-polar solvent in the first step, thereby controlling the surface potential of the wafer surface. Thus, the process of metal deposition during the dipping of the wafer in hydrofluoric acid is considered to be facilitated, and the dissolution reaction of Si in the second step is considered to proceed uniformly. Moreover, treatment using lower alcohols removes organic matter on the wafer surface, which is considered to also promote the above reaction.

In the first group of the present inventions, large-scale apparatuses such as a DC power supply and an ion implantation system are not necessary, and mixing of hydrofluoric acid with an organic solvent and use of an oxidant with hydrofluoric acid are not required. Thus, a solar cell wafer at whose surface reflection loss of light is reduced can be obtained by making a surface of a semiconductor wafer typified by a silicon wafer porous in a safer and less expensive manner than conventional techniques.

In this embodiment, it is preferable to further perform a third step of applying hydrofluoric acid free of metal ions to the at least one surface of the wafer (step S3) after the second step. Specifically, the wafer after the second step can be dipped in hydrofluoric acid free of metal ions for a predetermined time. With this step, the depth of the irregularities formed on the surface in the second step can be controlled.

Further, the second step and/or the third step are preferably performed with the wafer being exposed to light. This is because the second step being performed with the wafer being exposed to light further facilitates making the surface porous by the above reaction mechanism. Further, the third step performed with the wafer being exposed to light provides the desired surface conditions of the wafer surface by controlling the exposure conditions. The light exposure is performed by irradiation of the reaction surface with in particular, fluorescent light, halogen light, and the like.

At least after the second step, after the third step in this embodiment, it is preferable to perform a step of applying a solution for removing metal (microparticles) precipitated from the metal ions, from the one surface, to the at least one surface of the wafer (step S4). For example, when hydrofluoric acid in which Cu is dissolved is used in the second step, a nitric acid solution is applied to the one surface to remove the Cu microparticles left on the one surface. With this step, the metal particles left and attached to the wafer surface can be removed.

In this embodiment, through these steps, a solar cell wafer in which the wafer surface is made porous can be obtained. Preferred embodiments of the several steps will be described below. Note that the lower alcohol treatment in the first step, the metal-ion-containing hydrofluoric acid treatment in the second step, and the metal-ion-free hydrofluoric acid treatment in the third step are herein collectively referred to as a "porous structure making process".

(First Step: Lower Alcohol Treatment)

"Lower alcohol" herein means any linear or branched chain alcohol having 10 carbon atoms or less. When the number of the carbon atoms is more than 10, the viscosity of the alcohol is increased so that the wafer surface would be coated with the alcohol. When the number of the carbon atoms is 10 or less, the alcohol can be used as a runny non-polar solvent for making the wafer surface a non-polar surface. Typically, alcohols include methanol, ethanol, 2-propanol, N-methylpyrrolidone, ethylene glycol, glycerin, benzyl alcohol, phenyl alcohol, and the like; however, ethanol and 2-propanol (isopropyl alcohol: IPA) are preferably used considering the toxicity and cost. The treatment time, that is, the time during which the lower alcohol solution is applied to the wafer (the time for which contact between a treatment solution and a wafer is maintained in each step is hereinafter referred to as "treatment time") is not limited in particular but preferably 0.5 min to 10 min, more preferably 3 min or less. When the treatment time is 0.5 min or more, the effect of reducing reflectance can be sufficiently achieved. Even if the treatment is performed for more than 10 min, the effect of reducing reflectance is saturated. The temperature of the lower alcohol solution may be any temperature as long as the alcohol is not evaporated or solidified, and may be, for example, room temperature.

(Second Step: Metal-Ion-Containing Hydrofluoric Acid Treatment)

In this embodiment, metal ions are preferably ions of metals more noble than Si, such as, for example, Cu, Ag, Pt, and Au. With these noble metal ions, precipitation of metal microparticles and dissolution of Si can effectively occur at the wafer surface in the second step. Considering the cost, Cu ions are preferably used. The preferable conditions in terms of sufficiently achieving the effect of reducing reflectance will be given below. In hydrofluoric acid in which metal is dissolved, the metal concentration is preferably 10 ppm to 1000 ppm, more preferably, 100 ppm to 400 ppm. Further, the concentration of the hydrofluoric acid is preferably 2 mass % to 50 mass %, more preferably, 10 mass % to 40 mass %, still more preferably, 20 mass % to 30 mass %. The treatment time is preferably 0.5 min to 30 min, more preferably, 1 min to 10 min, still more preferably, 3 min or less. The temperature of the metal-containing hydrofluoric acid may be selected as appropriate in consideration of the treatment time, evaporative loss, and the like. The temperature is preferably room temperature to 100° C.

(Third Step: Metal-Ion-Free Hydrofluoric Acid Treatment)

In this embodiment, in order to expand the depth of the irregularities formed on the wafer surface to an appropriate depth, the concentration of hydrofluoric acid is preferably 2 mass % to 50 mass %, more preferably 20 mass % to 30 mass %. "Hydrofluoric acid free of metal ions" herein refers not only to hydrofluoric acid strictly free of metal ions, but also to hydrofluoric acid containing metal of less than 10 ppm as impurities. For example, if the concentration of ions of metals more noble than Si, such as Cu, Ag, Pt, and Au is less than 10 ppm; the reaction which further increases the depth of the irregularities already formed in the second step is dominant over precipitation of the metal microparticles, without formation of new irregularities on the wafer surface. The treatment time may be set to suit the process tact time, and may be preferably 0.5 min to 60 min. The temperature of the metal-ion-free hydrofluoric acid may be selected as appropriate in consideration of the treatment time, evaporative loss, and the like. The temperature is preferably room temperature to 100° C.

(Metal-Removing-Solution Treatment)

In this embodiment, when Cu is used as a metal in the second step, Cu microparticles can be removed with a nitric acid ($HNO_3$) solution. On this occasion, the concentration of nitric acid is preferably in the range of 0.001% to 70%, more preferably in the range of 0.01% to 0.1%. The treatment time may be set to suit the process tact time, and is preferably 0.5 min to 10 min, more preferably 1 min or more and less than 3 min. The temperature of the nitric acid solution may be selected as appropriate in consideration of the treatment time, evaporative loss, and the like. The temperature is preferably room temperature to 100° C. The treatment solution used in this step is not limited to nitric acid, and a solution may be selected which is capable of dissolving the metal to be removed. When Ag, Pt, and Au are to be removed, for example, aqua regia ($HCl/HNO_3$) or a potassium iodide solution (KI) can be used. The preferable concentration and the preferable treatment time are the same as those in the case of the metal being Cu.

Examples of a method for applying the treatment solution to the wafer surface in each step include, for example, dip coating and spray coating. Alternatively, cast coating may be used in which the treatment solution is dropped on one surface of the wafer which serve as the light receiving surface.

In addition, the porous structure making process may further include a water cleaning step after at least one step of the first to third steps.

Thus, the method of producing a solar cell wafer according to the first group of the present inventions has been described with its operation and effect. There are two additional advantages of this producing method as follows. The first advantage is that this production method can be applied not only to single crystal silicon wafers but also to polycrystalline silicon wafers. As described above, the method of forming a textured structure is a method suitable for single crystal silicon. Thus, it has been difficult to form a uniform textured structure throughout the wafer surface of polycrystalline silicon in which various planes are present in the surface. In contrast, this porous structure making process allows finer irregularities to be formed on the wafer surface as compared with the existing textured structure. Thus, the reflectance at the surface of a polycrystalline silicon wafer can also be sufficiently reduced by a safe and low cost method. The second advantage is that an oxidant such as hydrogen peroxide is not required as a treatment solution in this production method. This can prevent effluent treatment from being complex.

The method of producing a solar cell wafer to be used in a crystalline silicon solar cell from a single crystal or polycrystalline silicon wafer has been described. However, the present invention is not limited to crystalline silicon, and it can also be applied to a solar cell wafer used for an amorphous silicon solar cell or a thin film solar cell.

(Method of Producing Solar Cell)

A method of producing a solar cell in accordance with the first group of the present inventions includes the steps in the method of producing a solar cell wafer in accordance with the first group of the present inventions, which have been described, and also a step of fabricating a solar cell using the solar cell wafer. The process of fabricating the solar cell at least includes a step of forming a pn junction by dopant diffusion heat treatment and a step of forming electrodes. The dopant diffusion heat treatment makes phosphorus be diffused in a p-substrate.

Note that the step of forming a pn junction may be performed before the porous structure making process. Specifically, after etching for removing damages due to slicing, the porous structure making process is performed with a wafer having a pn junction formed by the dopant diffusion heat treatment. Electrodes may be formed in the thus obtained solar cell wafer to obtain a solar cell.

According to the method of producing a solar cell in accordance with the first group of the present inventions, reflection loss of incident light at the light receiving surface of the solar cell can be reduced, thus obtaining a solar cell having high conversion efficiency.

(Method of Producing Solar Cell Module)

A method of producing a solar cell module in accordance with the first group of the present inventions includes the steps in the foregoing method of producing a solar cell and also a step of fabricating a solar cell module using the solar cell. The process of fabricating the module includes a step of arranging a plurality of solar cells and wiring electrodes, a step of arranging wired solar cells on a reinforced glass substrate and encapsulating the solar cells with resin and a protective film, and a step of assembling an aluminum frame and electrically connecting terminal cables to wires.

According to the method of producing a solar cell module in accordance with the first group of the present inventions, reflection loss of incident light at the light receiving surface of a cell can be reduced, thus obtaining a solar cell module having high conversion efficiency.

(Second Group of the Present Inventions: Solar Cell Wafer)

Figure 8:
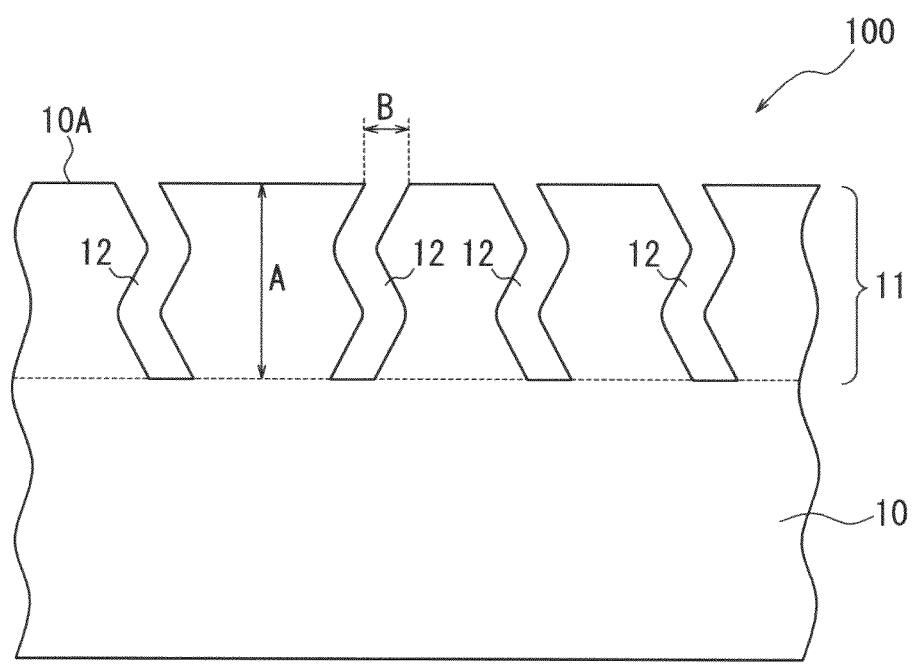
FIG. 8 is a schematic cross-sectional view of a solar cell wafer 100 in accordance with the second group of the present inventions.

Embodiments of a solar cell wafer of the second group of the present inventions will be described below with reference to the drawings. FIG. 8 is a schematic cross-sectional view of a solar cell wafer 100 in accordance with the second group of the present inventions. In FIG. 8, the thickness of a porous layer 11 and the size of pores 12 are enlarged as compared with the thickness of a semiconductor wafer 10.

The second group of the present inventions is a solar cell wafer having a porous layer on at least one surface of a semiconductor wafer. Accordingly, a "solar cell wafer" herein means a wafer at least one surface of which is made porous. The one surface serves as a light receiving surface in a solar cell. Specifically, the solar cell wafer 100 has the porous layer 11 on one surface 10A of the semiconductor wafer 10.

The semiconductor wafer 10 is not limited in particular, and may be, for example, a single crystal or polycrystalline silicon wafer as described in relation to the first group of the present inventions.

The solar cell wafer 100 has a structure characteristically having the porous layer 11 with a layer thickness of more than 50 nm and 450 nm or less and a pore diameter of 10 nm to 45 nm on its surface 10A. The present inventor attempted to further reduce reflection loss of incident light as compared with a solar cell wafer obtained by a conventional porous structure making method. The inventor found with respect to the solar cell wafer 100 provided with the porous layer 11 having the above specified structure, that the surface apparently turned to black and the reflectance at each of the wavelengths throughout the visible spectrum can be significantly reduced. Thus, the second group of the present inventions was completed.

According to the studies of the present inventor, when the pore diameter of the pores 12 in the porous layer 11 is less than 10 nm, light does not reach the inside of the pores in the porous layer, so that the light is reflected at around the superficial layer of the porous layer, which makes it impossible to sufficiently reduce reflectance of visible light. Whereas when the pore diameter is more than 45 nm, light easily reaches the bottom of the porous layer, so that the light is reflected by the bottom toward the superficial layer, which also makes it impossible to sufficiently reduce reflectance of visible light.

In terms of further reducing reflectance, the pore diameter is preferably in the range of 20 nm to 40 nm.

When the layer thickness of the porous layer 11 is 50 nm or less, light easily reaches the bottom of the porous layer, so that the light is reflected by the bottom toward the superficial layer, which makes it impossible to sufficiently reduce reflectance of visible light. Whereas the layer thickness is more than 450 nm, the depth of the pores is comparable to a visible wavelength, so that resonant action occurs in the porous layer, which also makes it impossible to sufficiently reduce reflectance of visible light. Further, in terms of further reducing reflectance, the layer thickness of the porous layer 11 is preferably in the range of 100 nm to 400 nm, more preferably in the range of 150 nm to 400 nm, still more preferably in the range of 250 nm to 350 nm.

The second group of the present inventions characteristically has a porous layer provided with a number of micropores having a smaller pore diameter than conventional. When a wafer surface is made porous by anodic oxidation as in PTL 1, a porous layer provided with large pores having a size greatly different from the ones of the present invention are formed in the surface as in the examples of PTL 1, in which the layer thickness of the porous layer is 50 μm to 25 μm. Although PTL 3 does not disclose the layer thickness of a porous layer and the pore diameter of pores, the diameter of the pores observed in the SEM images is larger than that in the present invention.

Figure 9:
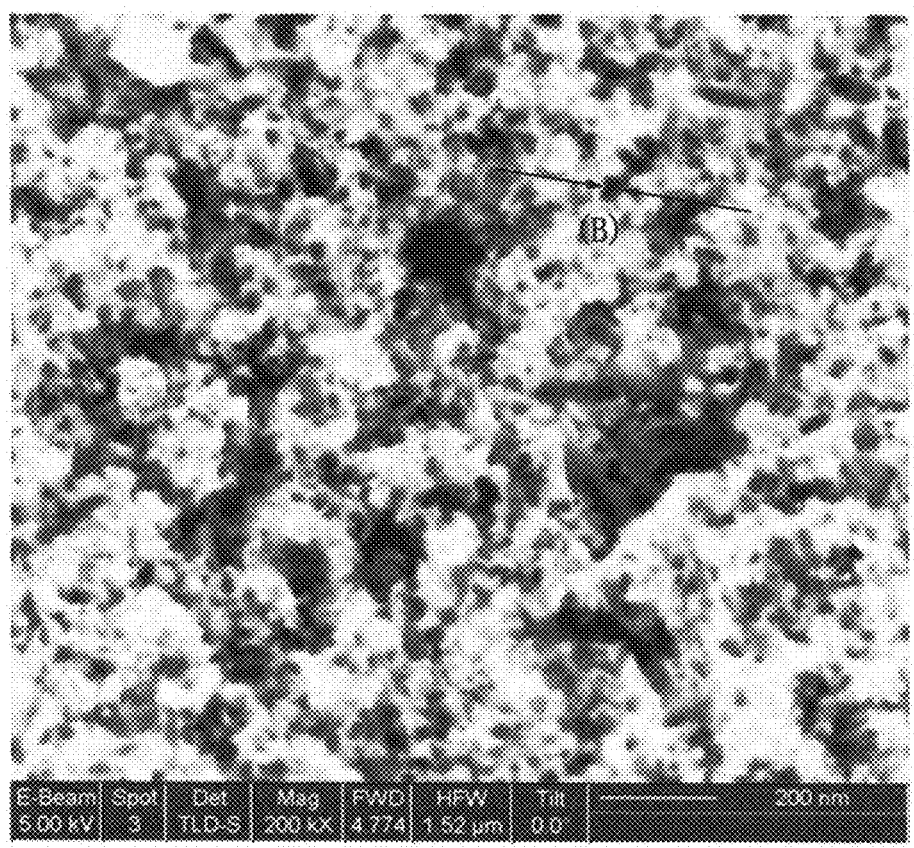
FIG. 9 is a photograph of a surface of a solar cell wafer in accordance with the second group of the present inventions, observed by SEM.

The "pore diameter" herein is defined as the average of the diameters of the apertures of a plurality of pores in the semiconductor wafer surface, which are seen by observation of any surface of a solar cell wafer using a scanning electron microscope (SEM). FIG. 9 is a photograph of a surface of a solar cell wafer in accordance with the second group of the present inventions, observed by SEM. In this case, the diameters of the apertures of a plurality of pores shown in the photograph are measured to calculate the average, thereby determining the pore diameter. In FIG. 9, (B) indicates the diameter of a certain pore.

Figure 10:
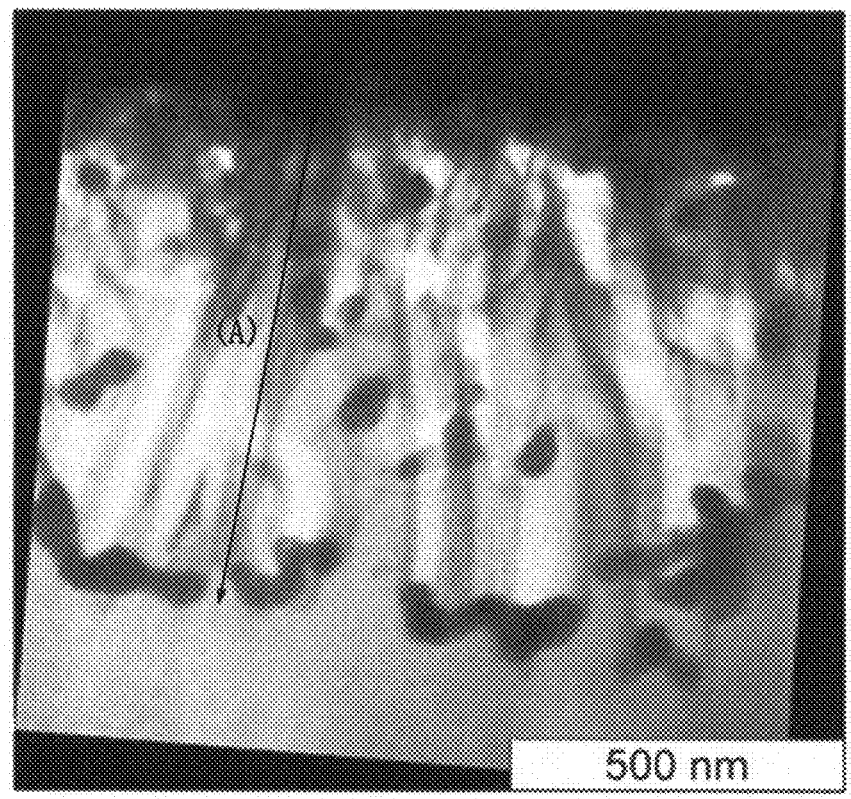
FIG. 10 is a photograph of a cross section of a solar cell wafer in accordance with the second group of the present inventions, observed by TEM.

The "layer thickness of porous layer" herein is defined as the average depth (the shortest distance from the surface to the pore bottom) of a plurality of pores seen by observation of any cross section of a solar cell wafer using a transmission electron microscope (TEM). FIG. 10 is a photograph of a cross section of a solar cell wafer in accordance with the second group of the present inventions, observed by SEM. In this case, the depths of a plurality of pores shown in the photograph are measured to calculate the average, thereby determining the layer thickness of the porous layer. In FIG. 10, (A) indicates the depth of a certain pore.

The pores 12 in the porous layer 11 are preferably meandering. Light is absorbed when the light reaches a surface of the wafer, such as the inner wall of a pore. Accordingly, the more times light entering pores are reflected inside the pores, the more efficiently the incident light can be absorbed, thus effectively reducing reflection loss. Here, when the pores are meandering, the number of times of light reflection inside the pores is more than that in the case of linear pores. Therefore, reflectance at a wafer surface with meandering pores can be lower than that with linear pores when the porous layers have the same thickness. In order that a porous layer with linear pores achieves equal light absorption property to a porous layer with meandering pores, the thickness of the porous layer with linear pores is required to be thick. However, when the layer thickness is large, the aspect ratio of the pore is high and the strength of pores in the lateral direction perpendicular to the depth direction becomes low. This results in a problem of the pore wall strength.

Further, the plurality of pores 12 in the porous layer 11 are meandering in different random directions, and the pores are preferably formed into the form of a foam sponge. This can ensure sufficient strength of the porous layer 11, and the porous layer 11 is hardly damaged due to external pressure caused by contact or the like.

In terms of sufficiently achieving the effect of reducing reflectance of incident light, the density of pores 12 in the porous layer 11 is preferably about 50 to 300 (pores/$\mu m^2$) with respect to the number of pores visible on the porous layer surface.

The solar cell wafer 100 can achieve low reflectance at wavelengths throughout the visible spectrum. In particular, the surface reflectance at a wavelength of 600 nm is preferably 10% or less, more preferably 5% or less. Sunlight contains many rays having a wavelength of 500 nm to 700 nm, so that the reflectance in this wavelength range is used for evaluating the performance of a solar cell wafer.

The solar cell wafer 100 can be obtained, for example, by a method of producing a solar cell wafer in accordance with the above first group of the present inventions.

The present inventor discussed the relationship between the structure of a porous layer and the reflectance of solar cell wafers obtained by the production method of the first group of the present inventions. According to the studies, among these solar cell wafers, solar cell wafers having a porous layer with the above specific structure were found to achieve significantly low reflectance.

Pores having a small pore diameter can be formed by the method of the first group of the present inventions, since the aforementioned reduction reaction propagates into the wafer, which results in the formation of pores having a small pore diameter.

(First Step: Lower Alcohol Treatment)

The conditions of the first step can be set as appropriate to achieve the above pore diameter and layer thickness. For example, the conditions are as described above.

(Second Step: Metal-Ion-Containing Hydrofluoric Acid Treatment)

The conditions of the second step can also be set as appropriate to achieve the above pore diameter and layer thickness. Here, the longer the treatment time of this second step is, the larger the pore diameter and the layer thickness become. Therefore, the pore diameter of pores in the porous layer and its layer thickness can be controlled by adjusting the treatment time in this second step with the other conditions being constant. In particular, the pore diameter depends on the treatment time and the metal concentration in this second step, but it is suitably controlled with the treatment time. Under certain conditions, the treatment time can be 0.5 min or more and less than 10 min, preferably 1 min to 7 min.

After the second step, the third step described in relation to the first group of the present inventions may be further performed. With this step, the depth of the pores formed in the second step can be controlled.

(Third Step: Metal-Ion-Free Hydrofluoric Acid Treatment)

The conditions of the third step can also be set as appropriate to achieve the above pore diameter and layer thickness. The longer the treatment time is, the deeper the pores become. Therefore, the treatment time can be set to meet the target layer thickness of the porous layer, and is typically 0.5 min to 60 min.

After these steps, a step of applying an alkaline solution to the at least one surface of the wafer may be performed to lightly etch the porous structure. This can reduce the layer thickness of the porous layer to achieve the target layer thickness of the porous layer.

(Alkaline Solution Treatment)

The kind of alkali is not limited in particular. For example, a solution containing at least one alkali selected from the group consisting of inorganic alkalis such as lithium hydroxide, sodium hydroxide, potassium hydroxide, ammonium hydroxide and hydrazine, and organic alkalis such as tetramethylammonium hydroxide and choline can be used. The treatment time and the pH of this alkaline solution can be set in accordance with the thickness of a portion of the porous layer to be etched to achieve the target layer thickness. The pH is for example in the range of 9.0 to 14.0, preferably in the range of 10.0 to 12.0. The treatment time is for example 600 seconds or less, for example in the range of 10 seconds to 140 seconds, preferably in the range of 30 seconds to 120 seconds.

(Second Group of the Present Inventions: Solar Cell)

Next, an embodiment of a solar cell of the second group of the present inventions will be described. A solar cell of the second group of the present inventions includes a solar cell wafer in accordance with the second group of the present inventions, which has been described, and electrodes formed on the solar cell wafer. This solar cell can be produced by performing a cell fabrication process on this solar cell wafer. The cell fabrication process is as described above.

With respect to the solar cell of the second group of the present inventions, reflection loss of incident light at the light receiving surface of the solar cell can be further reduced.

(Second Group of the Present Inventions: Solar Cell Module)

Next, an embodiment of a solar cell module of the second group of the present inventions will be described. A solar cell module of the second group of the present inventions includes a plurality of the above solar cells arranged on a substrate. The solar cell module can be obtained by the above described method.

With respect to the solar cell module of the second group of the present inventions, reflection loss of incident light at the light receiving surface of the solar cell can be further reduced in the solar cell module.

The present invention has been described in the above descriptions to show only examples of typical embodiments. The present invention is not limited to those embodiments, and various modifications can be made within the scope of the present invention.

EXAMPLES

First Group of the Present Inventions

Examples of the first group of the present inventions and Comparative Examples will be described.

Experimental Example 1-1

Lower Alcohol Treatment

Preparation of Sample

Example 1

First, a 20 mm square p-type (100) single crystal silicon wafer was prepared. The wafer was etched using an acid solution prepared by mixing 50 mass % of hydrofluoric acid, 70 mass % of nitric acid, and water in 1:4:5 (volume ratio) at room temperature for 3 min. After that, the wafer was dried. All the subsequent steps were performed at room temperature. This wafer was dipped in 100 mass % 2-propanol (isopropyl alcohol: IPA) for 10 min. Subsequently, this wafer was dipped in a mixed solution of a 10 mL copper(II) nitrate solution containing 1000 ppm Cu, 10 mL of 50 mass % hydrofluoric acid, and 10 mL water for 10 min. This step was performed in normal room environment, that is, in a state where the wafer was exposed to light. After that, this wafer was dipped in 0.1 mass % nitric acid for 5 min to produce a solar cell wafer.

Example 2

A solar cell wafer was produced by the same method as Example 1 except that 99 mass % ethanol (ETOH), which is also a lower alcohol, was used instead of 100 mass % 2-propanol.

Comparative Example 1

A solar cell wafer was produced by the same method as Example 1 except that the step of dipping the wafer in 100 mass % 2-propanol for 10 min was not performed (the first step of the present invention was not performed).

Comparative Example 2

A solar cell wafer was produced by the same method as Example 1 except that a 30 mass % hydrogen peroxide solution, which is not a lower alcohol, was used instead of 100 mass % 2-propanol.

<Evaluation 1: Outside Photograph>

The treated surface of each wafer was observed by visual observation. FIG. 2(a) is a photograph taken of the surface of a silicon wafer which has been etched with an acid solution but not been subjected to the process of making a porous structure in accordance with the present invention. FIG. 2(b) is a photograph taken of the surface of a silicon wafer of Comparative Example 1. FIG. 2(c) and FIG. 2(d) are photographs taken of the surfaces of silicon wafers of Example 1 and Example 2, respectively. As shown in the photographs, the wafers of Example 1 and Example 2 looked all black. From this, the reflectance in the visible light range at the surfaces shown in Examples 1 and 2 is presumed to be reduced. On the other hand, little change was observed in the appearance of the surface in Comparative Example 1. The same applies to Comparative Example 2 (not shown).

<Evaluation 2: SEM>

The treated surface of each wafer was observed with a scanning electron microscope (Scanning Electron Microscope: SEM). FIGS. 3(a) to 3(d) are SEM images of the silicon wafer surfaces in FIGS. 2(a) to 2(d), respectively. As shown in FIG. 3(a), irregularities of approximately several micrometers were present on the surface of the silicon wafer, which had not been made porous in accordance with the present invention. These irregularities were formed by acid etching. In Comparative Example 1 (FIG. 3(b)) and Comparative Example 2 (not shown), the surface with irregularities were observed to be rough due to hydrofluoric acid. On the other hand, in Example 1 (FIG. 3(c)) and Example 2 (FIG. 3(d)), a number of finer irregular features are found to be further formed on the surface with irregularities of several micrometers.

<Evaluation 3: Reflectance Measurement>

The reflection spectrum of the treated surface of each wafer in the range of 300 nm to 1200 nm was measured using a reflectance measuring apparatus (manufactured by SHIMADZU CORPORATION: SolidSpec-3700). Sunlight contains many rays having a wavelength of 500 nm to 700 nm, so it is desirable that the reflectance in this wavelength range is low. The relative reflectance at wavelengths of 600 nm and 700 nm is shown in Table 1. "As ET" in Table 1 corresponds to the surface of the silicon wafer shown in FIG. 2(a) and FIG. 3(a), which was etched with acid solution and was not made porous in accordance with the present invention.

TABLE 1

|  | 600 nm Reflectance (%) | 700 nm Reflectance (%) | Remark |
| --- | --- | --- | --- |
| — | 26.59 | 25.34 | as ET |
| Comparative Example 1 | 30.84 | 29.67 | No treatment |
| Comparative Example 2 | 28.75 | 27.59 | $H_2O_2$ treatment |
| Example 1 | 4.20 | 4.01 | IPA treatment |
| Example 2 | 4.44 | 4.49 | ETOH treatment |

As shown in Table 1, the reflectance of the wafer was slightly increased in Comparative Examples 1 and 2 as compared to that in as ET. On the other hand, in Examples 1 and 2, the reflectance was significantly reduced as compared to that in as ET. This is because the surface was made porous as shown in FIGS. 3(c) and 3(d). This result shows that when the porous structure making process of the present invention is performed, which is safer and less costly than conventional, reflection loss of incident light can be reduced and a solar cell having high conversion efficiency can be manufactured.

Experimental Example 1-2

Relationship Between Lower Alcohol Treatment Time and Reflectance

Preparation of Sample

First, a 20 mm square p-type (100) single crystal silicon wafer was prepared. The wafer was etched using an acid solution prepared by mixing 50 mass % of hydrofluoric acid, 70 mass % of nitric acid, and water in 1:4:5 (volume ratio) at room temperature for 3 min. After that, the wafer was dried. All the subsequent steps were performed at room temperature. This wafer was dipped in 99 mass % ethanol (ETOH) for a predetermined time. Subsequently this wafer was dipped in a mixed solution of a 10 mL copper(II) nitrate solution containing 1000 ppm Cu, 10 mL of 50 mass % hydrofluoric acid, and 10 mL water for 10 min. This step was performed in normal room environment, that is, in a state where the wafer was exposed to light. After that, this wafer was dipped in 0.1 mass % nitric acid for 5 min to produce a solar cell wafer. Five types of samples were fabricated with the predetermined time being set at 0 min, 1 min, 3 min, 5 min, and 10 min. Note that 0 min means that the step was not performed.

<Evaluation: Reflectance Measurement>

The reflection spectrum of the 5 types of samples was measured in a similar manner as Experimental Example 1-1. The relative reflectance at wavelengths of 600 nm and 700 nm is shown in Table 2.

TABLE 2

| Ethanol treatment time (min) | 600 nm Reflectance (%) | 700 nm Reflectance (%) | Remark |
| --- | --- | --- | --- |
| 0 | 27.75 | 25.47 | Comparative Example |
| 1 | 3.12 | 2.96 | Example |
| 3 | 3.78 | 3.84 | Example |

TABLE 2-continued

| Ethanol treatment time (min) | 600 nm Reflectance (%) | 700 nm Reflectance (%) | Remark |
| --- | --- | --- | --- |
| 5 | 3.88 | 3.68 | Example |
| 10 | 3.57 | 3.36 | Example |

Table 2 shows that the ethanol treatment time of 1 min was sufficient, and the effect of reducing reflectance was sustained for 10 min or less.

Experimental Example 1-3

Relationship Between Metal Type and Reflectance

Preparation of Sample

First, a 20 mm square p-type (100) single crystal silicon wafer was prepared. The wafer was etched using an acid solution prepared by mixing 50 mass % of hydrofluoric acid, 70 mass % of nitric acid, and water in 1:4:5 (volume ratio) at room temperature for 3 min. After that, the wafer was dried. All the subsequent steps were performed at room temperature. This wafer was dipped in 99 mass % ethanol (ETOH) for 1 min. Subsequently, this wafer was dipped in a mixed solution of a 10 mL nitrate solution containing 1000 ppm of a predetermined metal (potassium chromate solution in the case of Cr), 10 mL of 50 mass % hydrofluoric acid, and 10 mL water for 3 min. This step was performed in normal room environment, that is, in a state where the wafer was exposed to light. After that, this wafer was dipped in 0.1 mass % nitric acid for 5 min to produce a solar cell wafer. Seven types of samples using Al, Cr, Mn, Fe, Co, Ni, and Cu as the predetermined metal were fabricated.

<Evaluation: Reflectance Measurement>

The reflection spectrum of the 7 types of samples was measured in a similar manner as Experimental Example 1-1. The relative reflectance at wavelengths of 600 nm and 700 nm is shown in Table 3. Note that "As ET" in Table 3 corresponds to the surface of the silicon wafer shown in FIG. 2(a) and FIG. 3(a), which was etched with acid solution and was not made porous in accordance with the present invention.

TABLE 3

| Metal type | 600 nm Reflectance (%) | 700 nm Reflectance (%) |
| --- | --- | --- |
| as ET | 25.83 | 24.48 |
| Al | 24.96 | 23.59 |
| Cr | 26.18 | 24.79 |
| Mn | 26.61 | 25.27 |
| Fe | 23.37 | 21.95 |
| Co | 22.87 | 21.52 |
| Ni | 24.78 | 23.42 |
| Cu | 3.09 | 3.27 |

As shown in Table 3, little effect of reducing reflectance was achieved in cases of using the metals other than Cu.

Experimental Example 1-4

Relationship Between Cu Concentration and Reflectance

Preparation of Sample

First, a 20 mm square p-type (100) single crystal silicon wafer was prepared. The wafer was etched using an acid solution prepared by mixing 50 mass % of hydrofluoric acid, 70 mass % of nitric acid, and water in 1:4:5 (volume ratio) at room temperature for 3 min. After that, the wafer was dried. All the subsequent steps were performed at room temperature. This wafer was dipped in 99 mass % ethanol (ETOH) for 1 min. Subsequently, this wafer was dipped in a mixed solution of a 10 mL copper(II) nitrate solution containing Cu dissolved at a predetermined concentration, 10 mL of 50 mass % hydrofluoric acid, and 10 mL water for 3 min. This step was performed in normal room environment, that is, in a state where the wafer was exposed to light. After that, this wafer was dipped in 0.1 mass % nitric acid for 5 min to produce a solar cell wafer. Seven types of samples were fabricated with the predetermined concentration (ppm) being set at 33.3, 83.3, 166.7, 250.0, 333.3, 500.0, and 666.7.

<Evaluation: Reflectance Measurement>

The reflection spectrum of the 7 types of samples was measured in a similar manner as Experimental Example 1-1. The relative reflectance at wavelengths of 600 nm and 700 nm is shown in FIGS. 4(a) and 4(b), respectively. As shown in both FIGS. 4(a) and 4(b), it was found that the reflectance was minimized in the Cu concentration range of 100 ppm to 400 ppm, and the effect of reducing the reflectance was low when the Cu concentration was more than 400 ppm. This shows that significantly high effect of reducing reflectance can be achieved when the Cu concentration is in the range of 100 ppm to 400 ppm.

Experimental Example 1-5

Relationship Between Hydrofluoric Acid Concentration and Reflectance

Preparation of Sample

First, a 20 mm square p-type (100) single crystal silicon wafer was prepared. The wafer was etched using an acid solution prepared by mixing 50 mass % of hydrofluoric acid, 70 mass % of nitric acid, and water in 1:4:5 (volume ratio) at room temperature for 3 min. After that, the wafer was dried. All the subsequent steps were performed at room temperature. This wafer was dipped in 99 mass % ethanol (ETOH) for 1 min. Subsequently, this wafer was dipped in a mixed solution of a 5 mL copper(II) nitrate solution containing 1000 ppm Cu and a 25 mL liquid mixture of hydrofluoric acid and water prepared at a predetermined concentration of hydrofluoric acid, for 3 min. This step was performed in normal room environment, that is, in a state where the wafer was exposed to light. After that, this wafer was dipped in 0.1 mass % nitric acid for 5 min to produce a solar cell wafer. Five types of samples were fabricated with the predetermined concentration (ppm) being set at 1.7, 8.3, 16.7, 25.0, and 33.3.

<Evaluation: Reflectance Measurement>

The reflection spectrum of the 5 types of samples was measured in a similar manner as Experimental Example 1-1. The relative reflectance at wavelengths of 600 nm and 700 nm is shown in FIGS. 5(a) and 5(b), respectively. Both FIGS. 5(a) and 5(b) show that significantly high effect of reducing reflectance can be achieved when the concentration of hydrofluoric acid is 10% or more.

Experimental Example 1-6

Relationship Between Second Step Treatment Time and Reflectance

Preparation of Sample

First, a 20 mm square p-type (100) single crystal silicon wafer was prepared. The wafer was etched using an acid solution prepared by mixing 50 mass % of hydrofluoric acid, 70 mass % of nitric acid, and water in 1:4:5 (volume ratio) at room temperature for 3 min. After that, the wafer was dried. All the subsequent steps were performed at room temperature. This wafer was dipped in 99 mass % ethanol (ETOH) for 1 min. Subsequently, this wafer was dipped in a mixed solution of a 10 mL copper(II) nitrate solution containing 1000 ppm Cu, 10 mL of 50 mass % hydrofluoric acid, and 10 mL water for a predetermined time. This step was performed in normal room environment, that is, in a state where the wafer was exposed to light. After that, this wafer was dipped in 0.1 mass % nitric acid for 5 min to produce a solar cell wafer. Seven types of samples were fabricated with the predetermined time being set at 0 min, 1 min, 3 min, 5 min, 10 min, 20 min, and 30 min. Note that 0 min means that the step was not performed.

<Evaluation: Reflectance Measurement>

Figure 6:
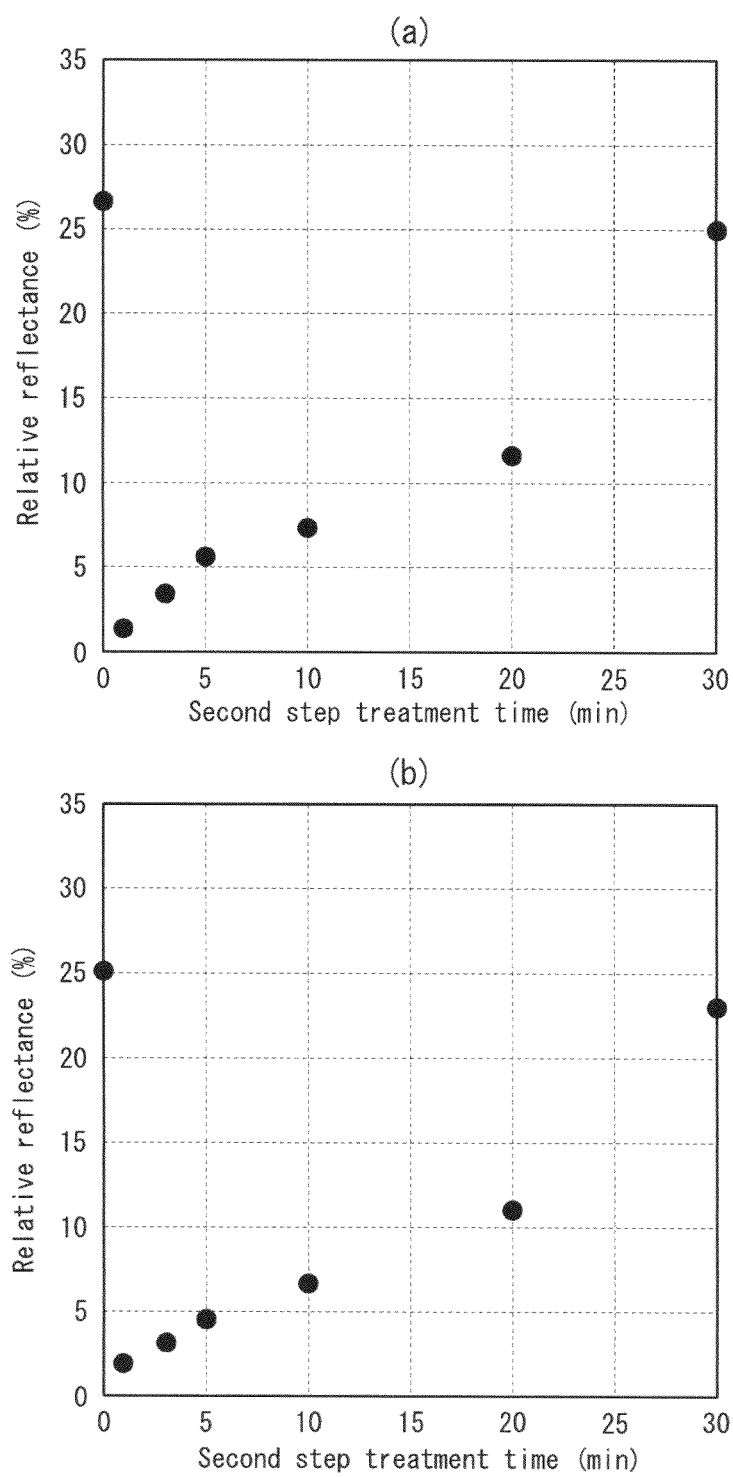
FIGS. 6(a) and 6(b) are graphs each showing the relationship between treatment time and relative reflectance at the silicon wafer surface in the second step.

The reflection spectrum of the 7 types of samples was measured in a similar manner as Experimental Example 1-1. The relative reflectance at wavelengths of 600 nm and 700 nm is shown in FIGS. 6(a) and 6(b), respectively. FIGS. 6(a) and 6(b) show that lower reflectance can be achieved when the treatment time is in the range of 1 min to 30 min than in the case of 0 min, and significantly high effect of reducing reflectance can be achieved when the treatment time is in the range of 1 min to 10 min.

Experimental Example 1-7

Control of Irregularity Depth by Third Step (Metal-Ion-Free Hydrofluoric Acid Treatment)

Sample 1

Example

First, a 20 mm square p-type (100) single crystal silicon wafer was prepared. The wafer was etched using an acid solution prepared by mixing 50 mass % of hydrofluoric acid, 70 mass % of nitric acid, and water in 1:4:5 (volume ratio) at room temperature for 3 min. After that, the wafer was dried. All the subsequent steps were performed at room temperature. This wafer was dipped in 100 mass % 2-propanol (isopropyl alcohol: IPA) for 10 min. Further, this wafer was dipped in a mixed solution of a 10 mL copper(II) nitrate solution containing 1000 ppm Cu, 10 mL of 50 mass % hydrofluoric acid, and 10 mL water for 3 min. This step was performed in normal room environment, that is, in a state where the wafer was exposed to light. A SEM image of a silicon wafer surface in this state is shown in FIG. 7(a). This is at the stage where steps up to the second step of the porous structure making process of the present invention had been performed.

Sample 2

Example

After the same steps as Sample 1 were performed, the wafer was dipped in a mixed solution of 15 mL of 50 mass % hydrofluoric acid containing no Cu dissolved and 15 mL water for 1 hr in the third step of the present invention. Note that this step was performed in a darkroom for blocking light. Subsequently, this wafer was dipped in 0.1 mass % nitric acid for 5 min to produce a solar cell wafer. A SEM image of a silicon wafer surface in this state is shown in FIG. 7(b).

Sample 3

Example

A solar cell wafer of Sample 3 was produced by the same method as Sample 2 except that the third step was performed in normal room environment, that is, in a state where the wafer was exposed to light. A SEM image of a silicon wafer surface in this state is shown in FIG. 7(c).

As shown in FIGS. 7(b) and 7(c), only finer irregular features were successfully formed on the wafer surface by performing the third step (metal-ion-free hydrofluoric acid treatment) for 1 hr, as compared with the irregularities of several micrometers observed in FIG. 7(a). The surface condition was found to be controlled by determining whether or not to expose the wafer to light. It was confirmed that the desired surface condition can be achieved by modification through the third step under controlled light exposure conditions.

Second Group of the Present Inventions

Examples of the second group of the present inventions and Comparative Examples will be described.

Experiment Example 2-1

Preparation of Sample

First, a 20 mm square p-type (100) single crystal silicon wafer (thickness: 4.25 mm) was prepared. The wafer was etched using an acid solution prepared by mixing 50 mass % of hydrofluoric acid, 70 mass % of nitric acid, and water in 1:4:5 (volume ratio) at room temperature for 3 min. After that, the wafer was dried. All the subsequent steps were performed at room temperature. This wafer was dipped in 99 mass % ethanol for 1 min. Subsequently, this wafer was dipped in a mixed solution of a 5 mL copper(II) nitrate solution containing 1000 ppm Cu, 15 mL of 50 mass % hydrofluoric acid, and 5 mL water for a predetermined time. This step was performed in normal room environment, that is, in a state where the wafer was exposed to light. After that, this wafer was dipped in 0.1 mass % nitric acid for 5 min, and was then dried in nitrogen atmosphere; thus, a solar cell wafer was produced. Six types of samples were fabricated with the predetermined time being set at 10 seconds, 1 min, 3 min, 5 min, 7 min, and 10 min.

<Evaluation 1: Electron Microscope Observation>

The treated surface of the wafer of each sample was observed with a scanning electron microscope (SEM) and a transmission electron microscope (TEM). Each sample was found to have a surface with irregularities of approximately several micrometers, on which a porous layer with a number of finer pores was formed. The wafer surface of the sample treated with the predetermined time being set at 3 min was observed by SEM, and the SEM photograph is shown in FIG. 9. A cross section in the vicinity of the wafer surface of the sample was observed by TEM, and the TEM photograph is shown in FIG. 10. The distance (B) in FIG. 9 was measured to find the pore diameter to be 20 nm. The distance (A) in FIG. 10 was measured to find the layer thickness to be 260 nm. The pore diameter and the layer thickness of the other samples were found in a similar manner. The results are shown in FIG. 4. As can be seen from FIG. 10, the pores forming the porous layer are meandering in random directions.

<Evaluation 2: Reflectance Measurement>

The reflection spectrum of the treated surface of the wafer of each sample in the range of 300 nm to 1200 nm was measured using a reflectance measuring apparatus (manufactured by SHIMADZU CORPORATION: SolidSpec-3700). The relative reflectance at a wavelength of 600 nm is shown in Table 4. According to this example, wafers can have porous layers having a pore diameter of 10 nm or more and 45 nm or less and a layer thickness of more than 50 nm and 450 nm or less. Further, the reflectance of each example at a wavelength of 600 nm was 10% or less, which was lower than that of comparative examples.

TABLE 4

| Cu containing HF solution treatment time | Pore diameter (nm) | Layer thickness (nm) | 600 nm Reflectance (%) | Remark |
| --- | --- | --- | --- | --- |
| 10 s | 5 | 70 | 20.5 | Comparative Example |
| 1 min | 10 | 180 | 4.91 | Example |
| 3 min | 20 | 260 | 2.95 | Example |
| 5 min | 30 | 350 | 4.78 | Example |
| 7 min | 40 | 390 | 9.11 | Example |
| 10 min | 50 | 520 | 10.32 | Comparative Example |

Experiment Example 2-2

Preparation of Sample

First, a 20 mm square p-type (100) single crystal silicon wafer (thickness: 4.25 mm) was prepared. The wafer was etched using an acid solution prepared by mixing 50 mass % of hydrofluoric acid, 70 mass % of nitric acid, and water in 1:4:5 (volume ratio) at room temperature for 3 min. After that, the wafer was dried. All the subsequent steps were performed at room temperature. This wafer was dipped in 99 mass % ethanol for 1 min. Subsequently, this wafer was dipped in a mixed solution of a 5 mL copper(II) nitrate solution containing 1000 ppm Cu, 15 mL of 50 mass % hydrofluoric acid, and 10 mL water for 10 min. This step was performed in normal room environment, that is, in a state where the wafer was exposed to light. After that, this wafer was dipped in 0.1 mass % nitric acid for 5 min and was then dried in nitrogen atmosphere. Further, the wafer was dipped in 0.1 mass % KOH for a predetermined time for alkaline solution treatment, and was then dried in nitrogen atmosphere. Thus, a solar cell wafer was produced. Ten types of samples were fabricated with the predetermined time being set at 5 s, 10 s, 20 s, 30 s, 60 s, 90 s, 120 s, 125 s, 150 s, and 180 s.

<Evaluation>

Observation using electron microscope photographs and reflectance measurement were carried out in a similar manner to Experimental Example 2-1. Each sample was found to have a surface with irregularities of approximately several micrometers, on which a porous layer with a number of finer pores was formed. The pore diameter, layer thickness, and the relative reflectance at a wavelength of 600 nm of each sample are shown in Table 5. According to this example, wafers can have porous layers having a pore diameter of 10 nm or more and 45 nm or less and a layer thickness of more than 50 nm and 450 nm or less. Further, the reflectance of each example at a wavelength of 600 nm was 10% or less, which was lower than that of comparative examples.

TABLE 5

| Alkaline solution treatment time (s) | Pore diameter (nm) | Layer thickness (nm) | 600 nm Reflectance (%) | Remark |
| --- | --- | --- | --- | --- |
| 180 | 25 | 20 | 20.43 | Comparative Example |
| 150 | 29 | 50 | 10.36 | Comparative Example |
| 125 | 30 | 52 | 9.75 | Example |
| 120 | 31 | 100 | 8.56 | Example |
| 90 | 35 | 200 | 7.00 | Example |
| 60 | 37 | 300 | 3.58 | Example |
| 30 | 40 | 400 | 8.58 | Example |
| 20 | 42 | 420 | 9.78 | Example |
| 10 | 44 | 450 | 9.95 | Example |
| 5 | 50 | 500 | 10.76 | Comparative Example |

INDUSTRIAL APPLICABILITY

According to the first group of the present inventions, a solar cell wafer at whose surface reflection loss of light is reduced can be obtained by making a surface of a semiconductor wafer typified by a silicon wafer porous in a safer and less expensive manner.

According to the second group of the present inventions, reflection loss of incident light can be further reduced.

REFERENCE SIGNS LIST

100: Solar cell wafer
10: Semiconductor wafer
10A: Surface of semiconductor wafer
11: Porous layer
12: Pores

The invention claimed is:

1. A method of producing a solar cell wafer by making at least one surface of a silicon wafer porous, comprising the steps of:
    a first step of applying a linear or branched chain alcohol having 10 or fewer carbon atoms therein to the at least one surface of the silicon wafer;
    a second step of applying hydrofluoric acid containing Cu ions to the at least one surface of the silicon wafer after the first step; and
    a step of applying a nitric acid solution to the at least one surface of the silicon wafer after the second step,
    wherein, in the first step, the concentration of the alcohol is at least 99 mass %, and the treatment time is 0.5 minutes to 10 minutes, and
    wherein, in the second step, the Cu concentration is 83.3 ppm to 666.7 ppm, the concentration of the hydrofluoric acid is 10 mass % to 40 mass %, and the treatment time is 0.5 minutes to 20 minutes.

2. The method of producing a solar cell wafer according to claim 1, further comprising a third step of applying hydrofluoric acid free of the Cu ions to the at least one surface of the silicon wafer after the second step.

3. The method of producing a solar cell wafer according to claim 2, wherein at least one of the second step and the third step are performed with the silicon wafer being exposed to light.

4. A method of producing a solar cell comprising the steps in the method of producing a solar cell wafer according to any one of claims 1, 2, and 3, and a step of fabricating a solar cell using the solar cell wafer.

5. A method of producing a solar cell module comprising the steps in the method of producing a solar cell according to claim 4 and a step of fabricating a solar cell module using the solar cell.

* * * * *